(12) United States Patent
Debroy et al.

(10) Patent No.: US 12,300,411 B1
(45) Date of Patent: May 13, 2025

(54) SYSTEM AND METHOD FOR NANOMAGNET BASED ADDER CIRCUIT

(71) Applicant: Ceremorphic, Inc., San Jose, CA (US)

(72) Inventors: Sanghamitra Debroy, Hyderabad (IN); Akshaykumar Salimath, Hyderabad (IN); Venkat Mattela, San Jose, CA (US)

(73) Assignee: Ceremorphic, Inc., San Jose, CA (US)

( * ) Notice: Subject to any disclaimer, the term of this patent is extended or adjusted under 35 U.S.C. 154(b) by 183 days.

(21) Appl. No.: 17/978,160

(22) Filed: Oct. 31, 2022

(51) Int. Cl.
   *H01F 10/32* (2006.01)
   *H03K 19/23* (2006.01)

(52) U.S. Cl.
   CPC ......... *H01F 10/3272* (2013.01); *H03K 19/23* (2013.01)

(58) Field of Classification Search
   CPC .......................... H01F 10/3272; H03K 19/23
   See application file for complete search history.

(56) References Cited

U.S. PATENT DOCUMENTS

2020/0365652 A1\* 11/2020 Hong ..................... H10B 61/00
2021/0203324 A1\* 7/2021 Manipatruni ........... H01L 28/55

\* cited by examiner

*Primary Examiner* — Daniel D Chang
(74) *Attorney, Agent, or Firm* — Minisandram Law Firm; Raghunath S. Minisandram

(57) ABSTRACT

A system and method for a device is disclosed. A first logic device and a second logic device are provided. Each of the first logic device and the second logic device include at least three inputs and one output, wherein, the output is based on majority of the inputs. The output of the first logic device is selectively fed to the second logic device, wherein, the first logic device and the second logic device together form an adder circuit.

18 Claims, 16 Drawing Sheets

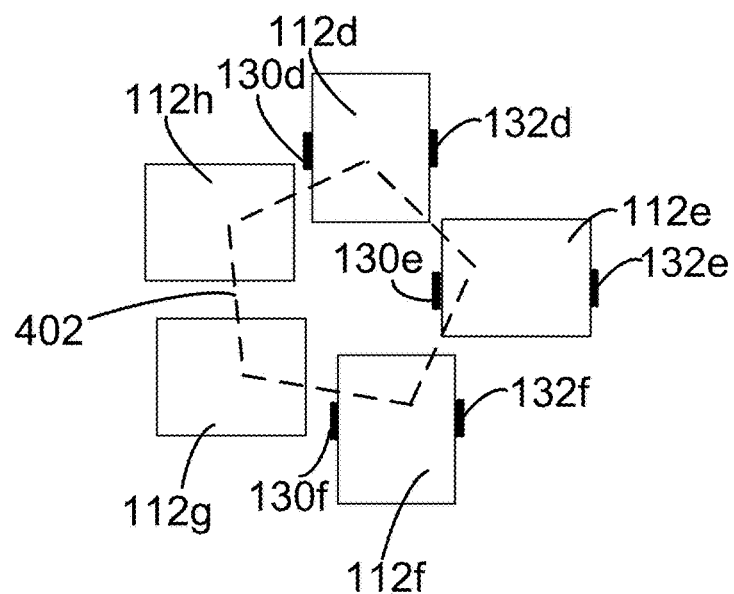
FIGURE 4A
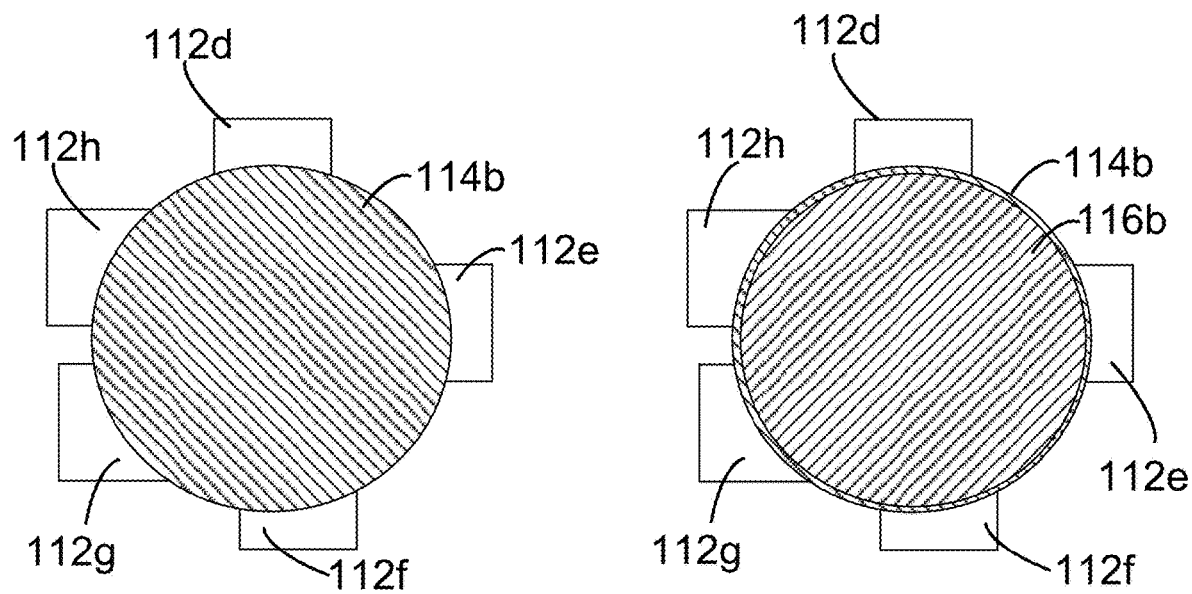
FIGURE 4B
FIGURE 4C

| | ORIGINAL INPUTS | | | INPUTS TO FIRST LOGIC DEVICE | | | OUTPUT OF FIRST LOGIC DEVICE | INPUTS TO SECOND LOGIC DEVICE | OUTPUT OF SECOND LOGIC DEVICE |
|---|---|---|---|---|---|---|---|---|---|
| | A | B | C | Ā | B̄ | C̄ | Cout | Ā B̄ C̄ Cout Cout | Osum |
| 512 | 0 | 0 | 0 | 1 | 1 | 1 | 0 | 11100 | 0 |
| 516 | 0 | 0 | 1 | 1 | 1 | 0 | 0 | 11000 | 1 |
| 518 | 0 | 1 | 0 | 1 | 0 | 1 | 0 | 10100 | 1 |
| 520 | 0 | 1 | 1 | 1 | 0 | 0 | 1 | 10011 | 0 |
| 522 | 1 | 0 | 0 | 0 | 1 | 1 | 0 | 01100 | 1 |
| 524 | 1 | 0 | 1 | 0 | 1 | 0 | 1 | 01011 | 0 |
| 526 | 1 | 1 | 0 | 0 | 0 | 1 | 1 | 00111 | 0 |
| 514 | 1 | 1 | 1 | 0 | 0 | 0 | 1 | 00011 | 1 |

FIGURE 5

SYSTEM AND METHOD FOR NANOMAGNET BASED ADDER CIRCUIT

RELATED APPLICATION

None

TECHNICAL FIELD

The present invention relates generally to logic devices and more specifically, to nanomagnet based logic devices.

DESCRIPTION OF RELATED ART

The complementary metal-oxide semiconductor (CMOS) technology based logic devices are reaching their physical limits in terms of reliability and power consumption in current day application. Further, continued requirement for minimal power consumption in computing devices configured to use these logic devices and utilization of semiconductor technology to construct these logic devices are desirable for mass adaptation of these devices. With these needs in mind, the current disclosure arises. This brief summary has been provided so that the nature of the disclosure may be understood quickly. A more complete understanding of the disclosure can be obtained by reference to the following detailed description of the various embodiments thereof in connection with the attached drawings.

SUMMARY OF THE INVENTION

In one embodiment, a method is disclosed. A first logic device and a second logic device are provided. Each of the first logic device and the second logic device include at least three inputs and one output, wherein, the output is based on majority of the inputs. The output of the first logic device is selectively fed to the second logic device, wherein, the first logic device and the second logic device together form an adder circuit.

In another embodiment, a logic device is disclosed. A first logic device and a second logic device are provided. Each of the first logic device and the second logic device include at least three inputs and one output, wherein, the output is based on majority of the inputs. The output of the first logic device is selectively fed to the second logic device, wherein, the first logic device and the second logic device together form an adder circuit.

This brief summary is provided so that the nature of the disclosure may be understood quickly. A more complete understanding of the disclosure can be obtained by reference to the following detailed description of the preferred embodiments thereof in connection with the attached drawings.

BRIEF DESCRIPTION OF THE DRAWINGS

The foregoing and other features of several embodiments are described with reference to the drawings. In the drawings, the same components have the same reference numerals. The illustrated embodiments are intended to illustrate but not limit the invention. The drawings include the following figures:

FIGS. 4A, 4B, and 4C show example construction of the second logic device, according to one aspect of the present disclosure;

FIG. 5 shows an example table with various inputs and corresponding output of the adder circuit, according to one aspect of the present disclosure;

DETAILED DESCRIPTION

To facilitate an understanding of the adaptive aspects of the present disclosure, an example adder circuit will be described. The specific construction and operation of the adaptive aspects of various elements of the example adder circuit is also described.

Figure 1:
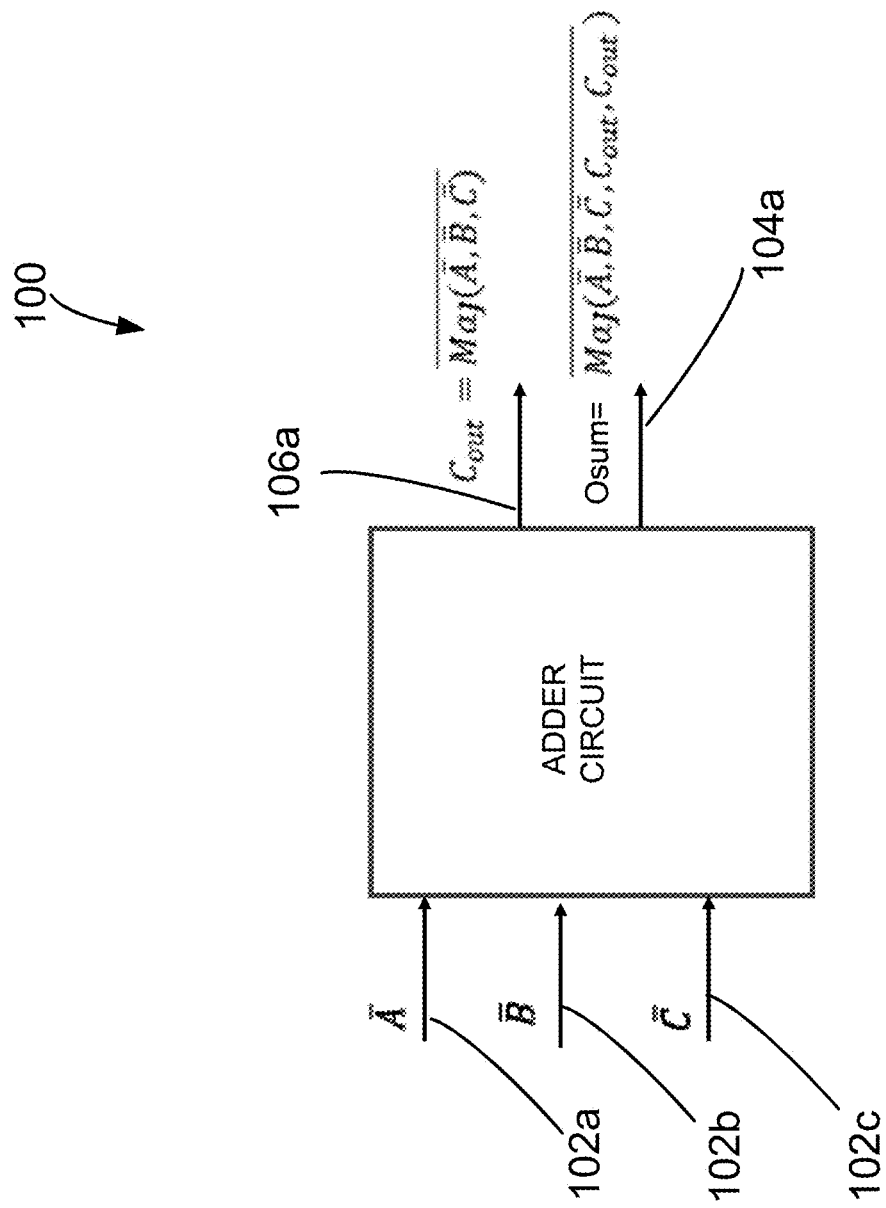
FIGS. 1 and 1A show an example adder circuit, according to one aspect of the present disclosure.

FIG. 1 shows an example adder circuit 100. In one example, the adder circuit 100 is configured as a one bit adder. The adder circuit 100 is configured to receive a plurality of inputs at input ports 102a, 102b, and 102c. The adder circuit 100 processes the received plurality of inputs at the input ports 102a, 102b, and 102c to provide a sum output Osum at sum output port 104a and a carry output Cout at carry output port 106a.

Figure 1A:
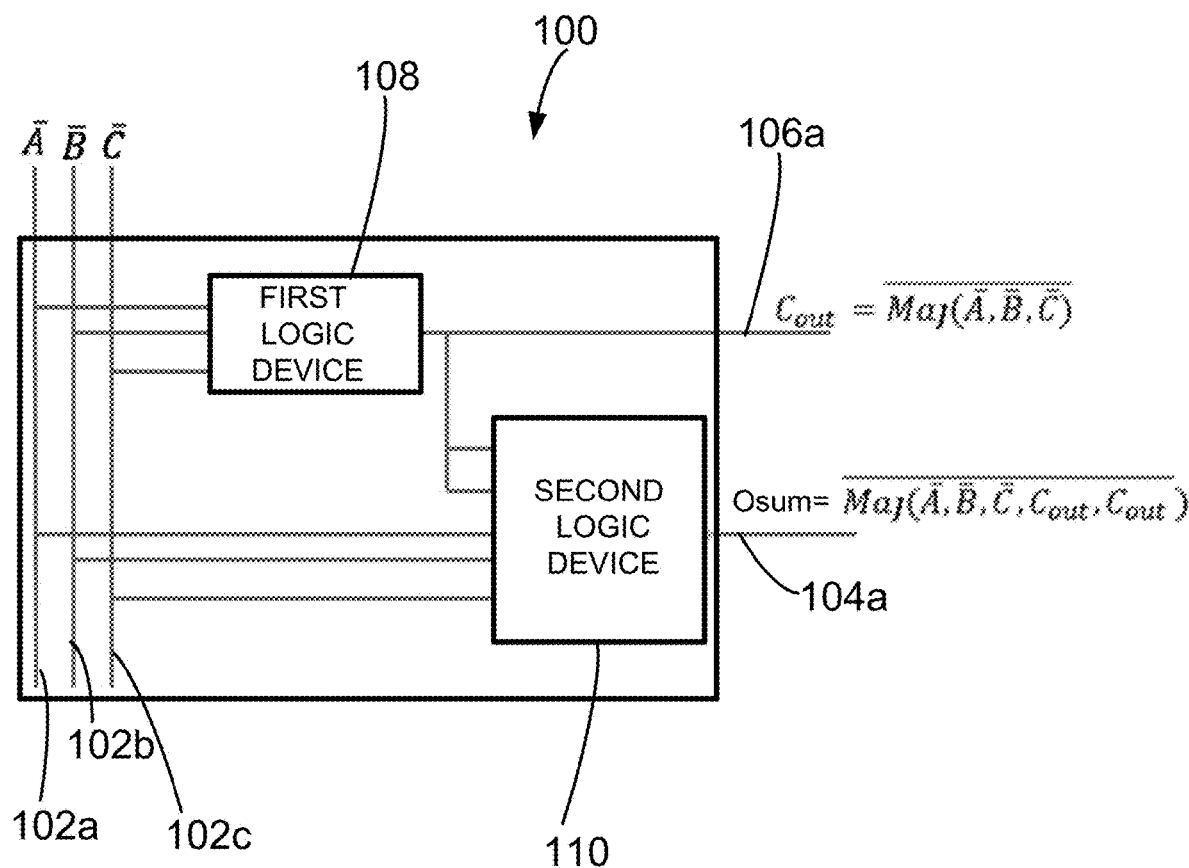

FIG. 1A shows further details of the adder circuit 100. The adder circuit 100 further includes a first logic device 108 and a second logic device 110. The first logic device 108 is configured as a three input majority gate. The first logic device 108 is configured to receive the plurality of inputs to the adder circuit 100 as input and provide an output indicative of the majority of the received inputs, as carry output Cout. The second logic device 110 is configured as a five input majority gate. The second logic device 110 is configured to receive the plurality of inputs to the adder circuit 100 as three of the inputs and receive the output Cout of the first logic device 108 as two of the inputs. The second logic device 110 provides an output indicative of the majority of the received inputs, as sum output Cout. In one example, the first logic device 108 and the second logic device 110 are implemented as a spin orbit torque (SOT) based interlayer exchange coupled nano device.

In one example, inverse of inputs A, B, and C are applied to the plurality of input ports 102a, 102b, and 102c. The first logic device 108 receives the inverse of inputs A, B, and C. The first logic device 108 provides the carry output Cout, indicative of the inverse of the majority of inputs received by the first logic device 108. The second logic device 110 receives the inverse of inputs A, B, and C as three of the inputs and Cout as two of the inputs. The second logic device 110 provides the sum output Osum, indicative of the inverse of the majority of inputs received by the second logic device 110. In one example, the first logic device 108 and the second logic device 110 are implemented as a spin orbit torque (SOT) based interlayer exchange coupled nano device. Now, construction and features of the first logic device 108 and the second logic device 110 will be described in detail, with reference to FIG. 2.

Figure 2:
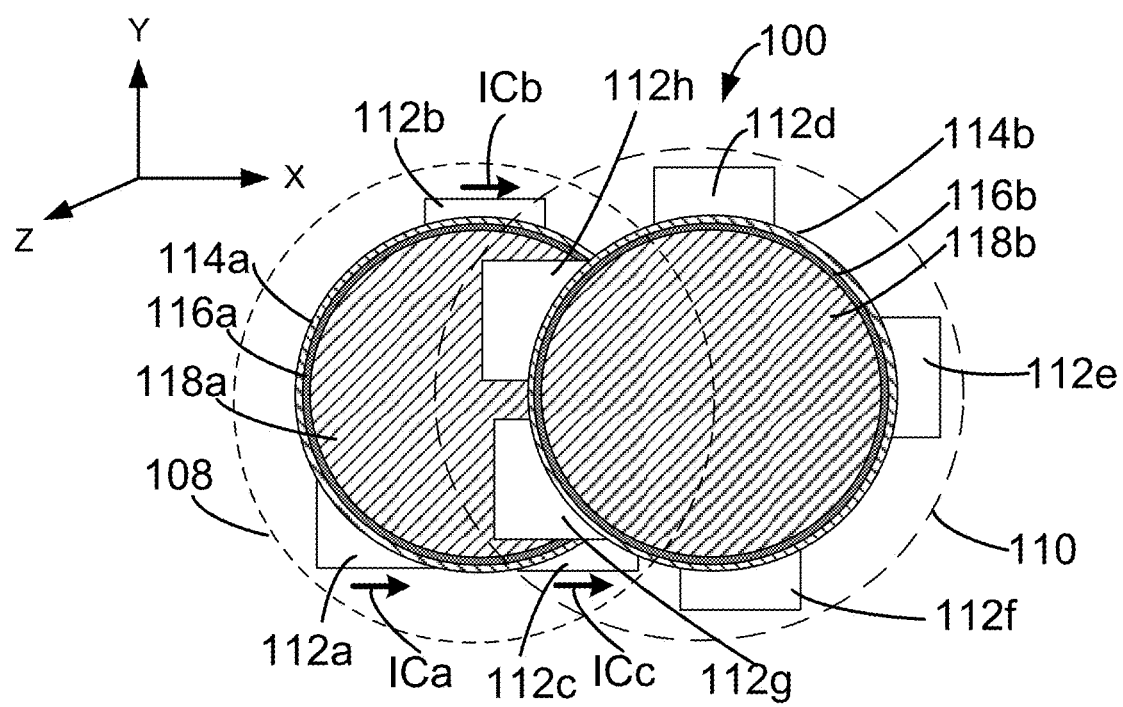
FIG. 2 shows plan view of the adder circuit, with a first logic device and a second logic device, according to one aspect of the present disclosure.

FIG. 2 shows a plan view of an example adder circuit 100. The adder circuit 100 includes the first logic device 108 and the second logic device 110. The first logic device 108 includes a first set of plurality of substrates, for example, a first substrate 112a, a second substrate 112b, and a third substrate 112c. A first nanomagnet 114a is disposed over the first substrate 112a, the second substrate 112b, and the third substrate 112c. First nanomagnet 114a may be sometimes referred to as first input nanomagnet 114a. A first spacer layer 116a is disposed over the first nanomagnet 114a. A first output layer 118a is disposed over the first spacer layer 116a.

The first substrate 112a, second substrate 112b, and the third substrate 112c are conductive metal layers. The first substrate 112a, the second substrate 112b, and the third substrate 112c are substantially made of heavy metal, such as an alloy of β-Tantalum (β-Ta), Platinum (Pt), or B-Tungsten (β-W), an alloy of heavy metal, a Cobalt/Platinum stack, or a topological insulator. In one example, first substrate 112a, second substrate 112b, and the third substrate 112c are each a layer of thin film with a very large spin hall angle, such as a layer of thin film of β-Tantalum (β-Ta), Platinum (Pt), or β-Tungsten (β-W) or an alloy of β-Tantalum (β-Ta), Platinum (Pt), or β-Tungsten (β-W), a Cobalt/Platinum stack, or a topological insulator. The first substrate 112a, the second substrate 112b, and the third substrate 112c are configured to receive a charge current and convert the charge current into a spin current, through spin Hall effect. For example, the first substrate 112a receives a first charge current ICa, second substrate 112b receives a second charge current ICb, and third substrate 112c receives a third charge current ICc.

The dimensions of first substrate 112a, second substrate 112b, and the third substrate 112c may be selected so as to have a charge current density of about $7.5e^{12}$ Amperes/meter$^2$ through each of the first substrate 112a, second substrate 112b, and third substrate 112c. As one skilled in the art appreciates, the first substrate 112a, second substrate 112b, and the third substrate 112c may be deposited on a base layer (not shown). In some examples, base layer may be a silicon wafer. Further details of the first logic device 108 will be described in detail with reference to FIGS. 3A, 3B, and 3C.

Figure 3A:
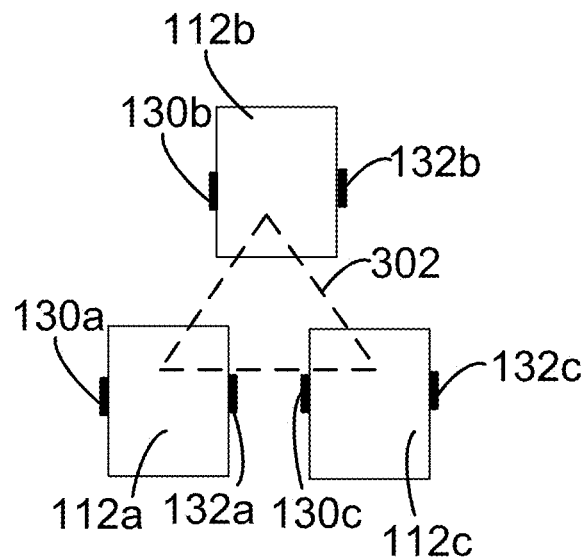
FIGS. 3A, 3B, and 3C show example construction of the first logic device, according to one aspect of the present disclosure.

Now, referring to FIGS. 3A, 3B, and 3C, further details of the first logic device 108 will be described. FIG. 3A shows the first substrate 102a, second substrate 102b, and third substrate 102c. The first substrate 102a, second substrate 102b, and third substrate 102c are selectively positioned about a vertex of an equilateral triangle 302. In one example, a pair of conductive pads are disposed about opposite sides of the first substrate 112a, second substrate 112b, and third substrate 112c so as to selectively pass the charge currents ICa, ICb, and ICc respectively, along the X axis.

For example, a first conductive pad 130a and a second conductive 132a are disposed about opposite sides of the first substrate 112a. Similarly, first conductive pad 130b and second conductive pad 132b are disposed about the opposite sides of the second substrate 112b. First conductive pad 130c and second conductive pad 132c are disposed about the opposite sides of the third substrate 112c. In one example, the conductive pads are substantially made of Copper or an alloy of Copper. As one skilled in the art appreciates, the direction of the charge current may be selectively changed, by passing the charge current from first conductive pads 130a-130c to second conductive pads 132a-132c (along +X axis) or from second conductive pads 132a-132c to first conductive pads 130a-130c (along –X axis). As previously mentioned, the first substrate 112a, second substrate 112b, and the third substrate 112c may be deposited on a base layer (not shown). Further, first conductive pads 130a-130c, and second conductive pads 132a-132c may be deposited on the base layer. In some examples, base layer may be a silicon wafer.

Figure 3B:
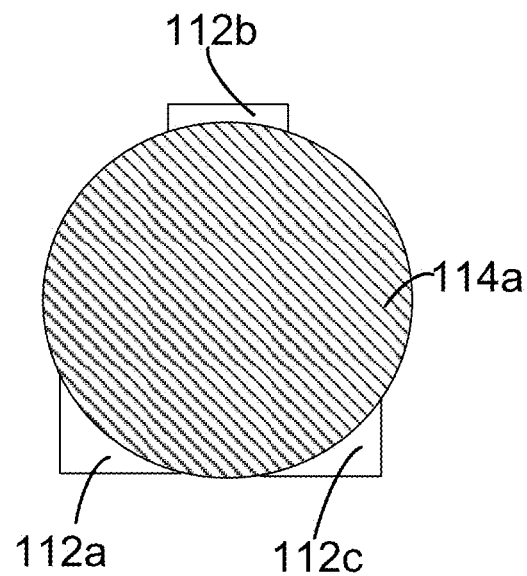

Now, referring to FIG. 3B, a first nanomagnet 114a is disposed over the first substrate 112a, the second substrate 112b, and the third substrate 112c. The first nanomagnet 114a acts as a single domain nanomagnet. As previously mentioned, the first substrate 112a, the second substrate 112b, and the third substrate 112c exhibit spin orbit torque effect, when charge currents ICa, ICb, and ICc are passed through the first substrate 112a, the second substrate 112b, and the third substrate 112c. Based on the direction of the charge current, the spin orientation of the single domain first nanomagnet 114a will be dependent on the majority of the input signals. As previously described with reference to FIG. 3A, in one example, by selectively placing the first substrate 112a, the second substrate 112b, and the third substrate 112c about the vertex of the equilateral triangle 302, they impart substantially equal effect on the first nanomagnet 114a.

Figure 3C:
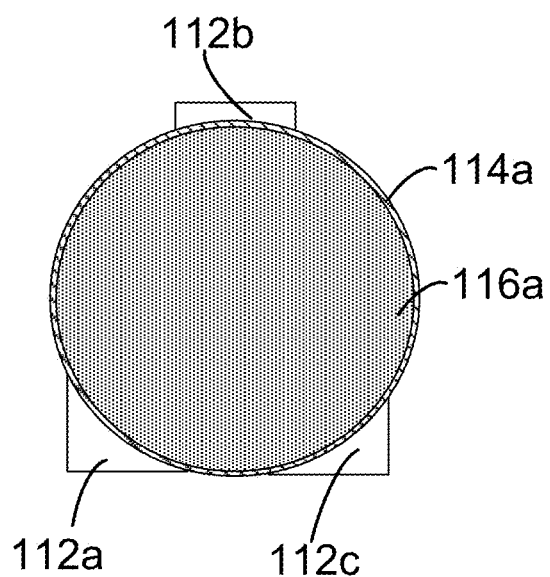

Now, referring to FIG. 3C, a first spacer layer 116a is disposed over the first nanomagnet 114a to substantially cover the first input nanomagnet 114a. The first spacer layer 116a is made of a non-magnetic material. The diameter of the spacer layer 116a in one example is about less than 12 nm. As previously described with reference to FIG. 2, the first output layer 118a is disposed over the first spacer layer 116a.

In one example, the first nanomagnet 114a is composed of a CoFe alloy. The first spacer layer 116a is a Ruthenium (Ru) or an alloy of Ruthenium deposited over the first nanomagnet 114a. In some examples, the first spacer layer 116 is a Magnesium Oxide (MgO) or an alloy of Magnesium Oxide. And the first output layer 118a is a CoFe alloy deposited over the first spacer layer 116a. In one example, a thickness of the first nanomagnet 114a is about 3 nm. The thickness of the first output layer 118a is about 1 nm. The dimensions of the first spacer layer 116a is so chosen so as to maintain a coupling strength J between the first nanomagnet 114a and the first output layer 118a to be maintained around $J=-1 \times 10^3$ J/m2. In one example, the thickness of the first spacer layer 116a is about 1 nm.

Now, referring back to FIG. 2, details of the second logic device 110 is described. The second logic device 110 includes a second set of plurality of substrates, for example, fourth substrate 112d, a fifth substrate 112e, a sixth substrate 112f, a seventh substrate 112g, and an eight substrate 112h. A second nanomagnet 114b is disposed over the fourth substrate 112d, the fifth substrate 112e, the sixth substrate 112f, the seventh substrate 112g, and the eight substrate 112h. Second nanomagnet 114b may be sometimes referred to as second input nanomagnet 114b. A second spacer layer 116b is disposed over the second nanomagnet 114b. A second output layer 118b is disposed over the second spacer layer 116b.

The fourth substrate 112d, the fifth substrate 112e, the sixth substrate 112f, the seventh substrate 112g, and the eight substrate 112h are conductive metal layers. The fourth substrate 112d, the fifth substrate 112e, the sixth substrate 112f, the seventh substrate 112g, and the eight substrate 112h are substantially made of heavy metal, such as an alloy of β-Tantalum (β-Ta), Platinum (Pt), β-Tungsten (β-W), an alloy of heavy metal, a Cobalt/Platinum stack, or a topological insulator. In one example, fourth substrate 112d, the fifth substrate 112e, the sixth substrate 112f, the seventh substrate 112g, and the eight substrate 112h are each a layer of thin film with a very large spin hall angle, such as a layer of thin film of β-Tantalum (β-Ta), Platinum (Pt), or β-Tungsten (β-W) or an alloy of β-Tantalum (β-Ta), Platinum (Pt), B-Tungsten (β-W), a Cobalt/Platinum stack, or a topological insulator. The fourth substrate 112d, the fifth substrate 112e, and the sixth substrate 112f are configured to receive a charge current and convert the charge current into a spin current, through spin Hall effect. For example, the fourth substrate 112d receives the first charge current ICa, fifth substrate 112e receives the second charge current ICb, and sixth substrate 112f receives the third charge current ICc.

The dimensions of fourth substrate 112d, the fifth substrate 112e, and the sixth substrate 112f may be selected so as to have a charge current density of about $7.5e^{12}$ Amperes/meter$^2$ through each of the fourth substrate 112d, the fifth substrate 112e, and the sixth substrate 112f. As one skilled in the art appreciates, the fourth substrate 112d, the fifth substrate 112e, and the sixth substrate 112f may be deposited on a base layer (not shown). In some examples, base layer may be a silicon wafer.

The seventh substrate 112g and the eight substrate 112h are disposed over the first output layer 118a. In one example, the seventh substrate 112g and the eight substrate 112h are configured to receive the output of the first logic device 108. Further details of the second logic device 110 will be described in detail with reference to FIGS. 4A, 4B, and 4C.

Now, referring to FIGS. 4A, 4B, and 4C, further details of the second logic device 110 will be described. FIG. 4A shows the fourth substrate 112d, the fifth substrate 112e, the sixth substrate 112f, the seventh substrate 112g, and the eight substrate 112h. The fourth substrate 112d, the fifth substrate 112e, the sixth substrate 112f, the seventh substrate 112g, and the eight substrate 112h are selectively positioned about a vertex of an equilateral pentagon 402. In one example, a pair of conductive pads are disposed about opposite sides of the fourth substrate 112d, fifth substrate 112e, and sixth substrate 112f so as to selectively pass the charge currents ICa, ICb, and ICc respectively, along the X axis.

For example, a first conductive pad 130d and a second conductive 132d are disposed about opposite sides of the fourth substrate 112d. Similarly, first conductive pad 130e and second conductive pad 132e are disposed about the opposite sides of the fifth substrate 112e. First conductive pad 130f and second conductive pad 132f are disposed about the opposite sides of the sixth substrate 112f. In one example, the conductive pads are substantially made of Copper or an alloy of Copper. As one skilled in the art appreciates, the direction of the charge current may be selectively changed, by passing the charge current from first conductive pads 130d-130f to second conductive pads 132d-132f (along +X axis) or from second conductive pads 132d-132f to first conductive pads 130d-130f (along-X axis). As previously mentioned, the fourth substrate 112d, fifth substrate 112e, and the sixth substrate 112f may be deposited on a base layer (not shown). Further, first conductive pads 130a-130e, and second conductive pads 132a-132e may be deposited on the base layer. In some examples, base layer may be a silicon wafer.

As previously described, the seventh substrate 112g and the eight substrate 112f are deposited over the first output layer 118a. In one example, the seventh substrate 112g and the eight substrate 112f are made up of inverse spin orbit charge (ISOC) material. Induced current ICcout is induced in the seventh substrate 112g and the eight substrate 112f, based on the status of the magnetic domain of the first output layer 118a. In other words, the magnetic domain of the first output layer 118a induces a current in the seventh substrate 112g and the eight substrate 112f. The induced current ICcout in the seventh substrate 112g and the eight substrate 112f corresponds to the output of the first logic device 108. In one example, the seventh substrate 112g, and the eight substrate 112h are each a layer of thin film with a very large spin hall angle, such as a layer of thin film of β-Tantalum (β-Ta), Platinum (Pt), or β-Tungsten (β-W) or an alloy of β-Tantalum (β-Ta), Platinum (Pt), β-Tungsten (β-W) or a topological insulator which acts as an ISOC material.

Now, referring to FIG. 4B, a second nanomagnet 114b is disposed over the fourth substrate 112d, the fifth substrate 112e, the sixth substrate 112f, the seventh substrate 112g, and the eight substrate 112h. The second nanomagnet 114b acts as a single domain nanomagnet. As previously mentioned, the fourth substrate 112d, the fifth substrate 112e, the sixth substrate 112f, the seventh substrate 112g, and the eight substrate 112h exhibit spin orbit torque effect, when charge currents ICa, ICb, ICc, ICcout and ICcout are passed through the fourth substrate 112d, the fifth substrate 112e, the sixth substrate 112f, the seventh substrate 112g, and the eight substrate 112h respectively. Based on the direction of the charge current, the spin orientation of the single domain second nanomagnet 114b will be dependent on the majority of the input signals. As previously described with reference to FIG. 4A, in one example, by selectively placing the fourth substrate 112d, the fifth substrate 112e, the sixth substrate 112f, the seventh substrate 112g, and eighth substrate 112h about the vertex of the equilateral pentagon 402, they impart substantially equal effect on the second nanomagnet 114b.

Now, referring to FIG. 4C, a second spacer layer 116b is disposed over the second nanomagnet 114b to substantially cover the second nanomagnet 114b. The second spacer layer 116b is made of a non-magnetic material. The diameter of the second spacer layer 116b is about less than 12 nm. As previously described with reference to FIG. 2, the second output layer 118b is disposed over the second spacer layer 116b.

In one example, the second nanomagnet 114b is composed of a CoFe alloy. The second spacer layer 116b is a Ruthenium (Ru) or an alloy of Ruthenium deposited over the first nanomagnet 114a. In some examples, the second spacer layer 116b is a Magnesium Oxide (MgO) or an alloy of Magnesium Oxide. And the second output layer 118b is a CoFe alloy deposited over the first spacer layer 116a. In one example, a thickness of the second nanomagnet 114b is about 3 nm. The thickness of the second output layer 118b is about 1 nm. The dimensions of the second spacer layer 116b is so chosen so as to maintain a coupling strength J between the second nanomagnet 114b and the second output layer 118b to be maintained around $J=-1\times10^{-3}$ J/m2. In one example, the thickness of the second spacer layer 116b is about 1 nm.

Having generally described the construction of the adder circuit 100, example general operation of the adder circuit 100 will now be described, with reference to FIG. 1. First, the operation of the first logic device 108 is described. Later, the operation of the second logic device 110 is described. The orientation of the magnetic domain of the first nanomagnet 114a is selectively set by passing the first charge current ICa, the second charge current ICb, and the third charge current ICc, through the first substrate 102a, the second substrate 102b, and the third substrate 102c, respectively. The orientation of the magnetic domain of the first nanomagnet 114a depends upon the direction of flow of the first charge current ICa, the second charge current ICb, and the third charge current ICc.

For example, when the first charge current ICa, second charge current ICb, and the third charge current ICc flows through the first substrate 102a, second substrate 102b, and the third substrate 102c, all in the +X direction, they will inject pure spin current in the Z direction through the spin Hall effect. The direction of current ICa, ICb, ICc in +X direction results in the electron polarization direction to be pointing along the +Y direction. The magnetization of the first nanomagnet 114a is subjected to the spin injection torque, resulting in induced magnetic direction, indicative of an orientation of the magnetic domain. The cumulative orientation of the magnetic domain in the first nanomagnet 114a is determined by the majority direction of the charge current. The direction of the majority of the charge current (+X or −X) will determine the orientation of the magnetic domain in the first nanomagnet 114a. As an example, an induced magnetic direction due to the charge current in the +X direction may indicate a logical value of 0, and an induced magnetic direction due to the charge current in the −X direction may indicate a logical value of 1.

The direction of flow of the first charge current ICa flowing through the first substrate 102a, the second charge current ICb flowing through the second substrate 102b, and the third charge current ICc flowing through the third substrate 102c are selectively set to indicate inverse of the input values of A, B, and C. This will determine the orientation of the magnetic domain in first nanomagnet 114a, which will indicate a value corresponding to the (majority (Inverse of A, B, and C)). The resultant magnetic domain of the first nanomagnet 114a gets antiferromagnetically exchange coupled to the first output nanomagnet 118a, through the first spacer layer 116a. The orientation of the magnetic domain of the first output nanomagnet 118a corresponds to the inverse of (majority (Inverse of A, B, and C)). In one example, the orientation of the magnetic domain of the first output nanomagnet 118a corresponds to the Cout value for the adder circuit 100. Further, the orientation of the magnetic domain of the first output nanomagnet 118a corresponds to the output of the first logic device 108. In one example, due to the strong exchange interaction arising from the interlayer exchange coupling between the first input nanomagnet 114a and the first output nanomagnet 118a through the first spacer layer 116a, a stable and reliable nanomagnetic device is realized.

In one example, charge current flows through the first substrate 102a, the second substrate 102b, and the third substrate 102c. The generated spin orbit torque in the first substrate 102a, the second substrate 102b, and the third substrate 102c drives the orientation of the magnetic field in the first nanomagnet 114a. The first output magnet 118a separated by the first spacer layer 106a obtains an antiferromagnetic coupling from the first nanomagnet 114a, where the first output magnet 118a is interlayer exchange coupled with the first nanomagnet 114a. As the first output magnet 118a is a single domain nanomagnet, the inverted state of the first nanomagnet 114a determines the state of the first output magnet 118a.

Having described the operation of the first logic device 108, the operation of the second logic device 110 is now described. As previously described, the second logic device 110 is configured as a five input majority gate device, with two of the inputs correspond to the output of the first logic device 108, for example, induced current ICcout induced in the seventh substrate 112g and the eight substrate 112f, based on the status of the magnetic domain of the first output layer 118a. The orientation of the magnetic domain of the second nanomagnet 114b is selectively set by passing the first charge current ICa through the fourth substrate 102d, the second charge current ICb through the fifth substrate 102e, the third charge current ICc through the sixth substrate 102f, induced current ICcout in the seventh substrate 112g and induced current ICcout in the eight substrate 112f. The orientation of the magnetic domain of the second nanomagnet 114b depends upon the direction of flow of the first charge current ICa, the second charge current ICb, the third charge current ICc, and the induced current ICcout.

For example, when the first charge current ICa, second charge current ICb, the third charge current ICc flows through the fourth substrate 102d, fifth substrate 102e, sixth substrate 102f respectively, and the induced current ICcout through the seventh substrate 102g, and the eighth substrate 102h, all in the +X direction, they will inject pure spin current in the Z direction through the spin Hall effect. The direction of current ICa, ICb, ICc, and ICcout in +X direction results in the electron polarization direction to be pointing along the +Y direction. The magnetization of the second nanomagnet 114b is subjected to the spin injection torque, resulting in induced magnetic direction, indicative of an orientation of the magnetic domain. The cumulative orientation of the magnetic domain in the second nanomagnet 114b is determined by the majority direction of the charge currents ICa, ICb, ICc, ICcout, and ICcout. The direction of the majority of the charge current (+X or −X) will determine the orientation of the magnetic domain in the second nanomagnet 114b. As an example, an induced magnetic direction due to the charge current in the +X direction may indicate a logical value of 0, and an induced magnetic direction due to the charge current in the −X direction may indicate a logical value of 1.

The direction of flow of the first charge current ICa flowing through the fourth substrate 102d, the second charge current ICb flowing through the fifth substrate 102e, and the third charge current ICc flowing through the sixth substrate 102f are selectively set to indicate inverse of the input values of A, B, and C. Further, two other inputs to the second logic device 110 is determined by the direction of flow of induced current ICcout. This will determine the orientation of the magnetic domain in second nanomagnet 114b, which will indicate a value corresponding to the (majority (Inverse of A, B, C), Cout, and Cout). The resultant magnetic domain of the second nanomagnet 114b gets antiferromagnetically exchange coupled to the second output nanomagnet 118b, through the second spacer layer 116b. The orientation of the magnetic domain of the second output nanomagnet 118b corresponds to the inverse of (majority (Inverse of A, B, C), Cout, Cout). In one example, the orientation of the magnetic domain of the second output nanomagnet 118b corresponds to the sum value (designated as Osum) of inverse of (A, B, C) for the adder circuit 100. Further, the orientation of the magnetic domain of the second output nanomagnet 118b corresponds to the output of the second logic device 110. In one example, due to the strong exchange interaction arising from the interlayer exchange coupling between the second nanomagnet 114b and the second output nanomagnet 118b through the second spacer layer 116b, a stable and reliable nanomagnetic device is realized.

In one example, charge current flows through the fourth substrate 102d, the fifth substrate 102e, the sixth substrate 102f, the seventh substrate 102g, and the eighth substrate 102h. The generated spin orbit torque in the fourth substrate 102d, the fifth substrate 102e, the sixth substrate 102f, the seventh substrate 102g, and the eighth substrate 102h drives the orientation of the magnetic field in the second nanomagnet 114b. The second output magnet 118b separated by the second spacer layer 116b obtains an antiferromagnetic coupling from the second nanomagnet 114b, where the second output magnet 118b is interlayer exchange coupled with the second nanomagnet 114b. As the second output magnet 118b is a single domain nanomagnet, the inverted state of the second nanomagnet 114b determines the state of the second output magnet 118b.

Now, referring to FIG. 5, an example table 500 is shown. Table 500 shows various inputs (A, B, C) in column 502, inverse of the inputs (A, B, C) applied to the adder circuit 100 in column 504, corresponding output Cout at the output of first logic device 108 in column 506, inputs applied to the second logic device 110 in column 508, and sum output Osum at the output of second logic device 110 in column 510.

For example, referring to row 512, inputs (A,B,C) value is (0,0,0) as shown in column 502, and the input applied to the first logic device 108 is (1,1,1) as shown in column 504, output of first logic device 108 is Cout, with a value of 0 as shown in column 506, input to the second logic device 110 is (1,1,1,0,0) as shown in column 508, and the output of the second logic device 110 Osum, with a value of 0 as shown in column 510. As one skilled in the art appreciates, for an input value of (0,0,0), the 1 bit adder sum output value is 0 and the carry Cout value is 0.

Similarly, referring to row 514, inputs (A,B,C) value is (1,1,1) as shown in column 502, and the input applied to the first logic device 108 is (0,0,0) as shown in column 504, output of first logic device 108 is Cout, with a value of 1 as shown in column 506, input to the second logic device 110 is (0,0,0,1,1) as shown in column 508, and the output of the second logic device 110 Osum, with a value of 1 as shown in column 510. As one skilled in the art appreciates, for an input value of (1,1,1), the 1 bit adder sum output value is 1 and the carry Cout value is 1.

Similarly, various other combinations of inputs (A,B,C) are shown in rows 516 to 526.

Now, referring to FIGS. 5A-5H, based on various input values applied to the adder circuit 100, as shown in table 500 of FIG. 5, corresponding orientation of the magnetic domain in the first nanomagnet 114a, first output magnet 118a, second nanomagnet 114b and the second output magnet 118b are shown.

Figure 5A:
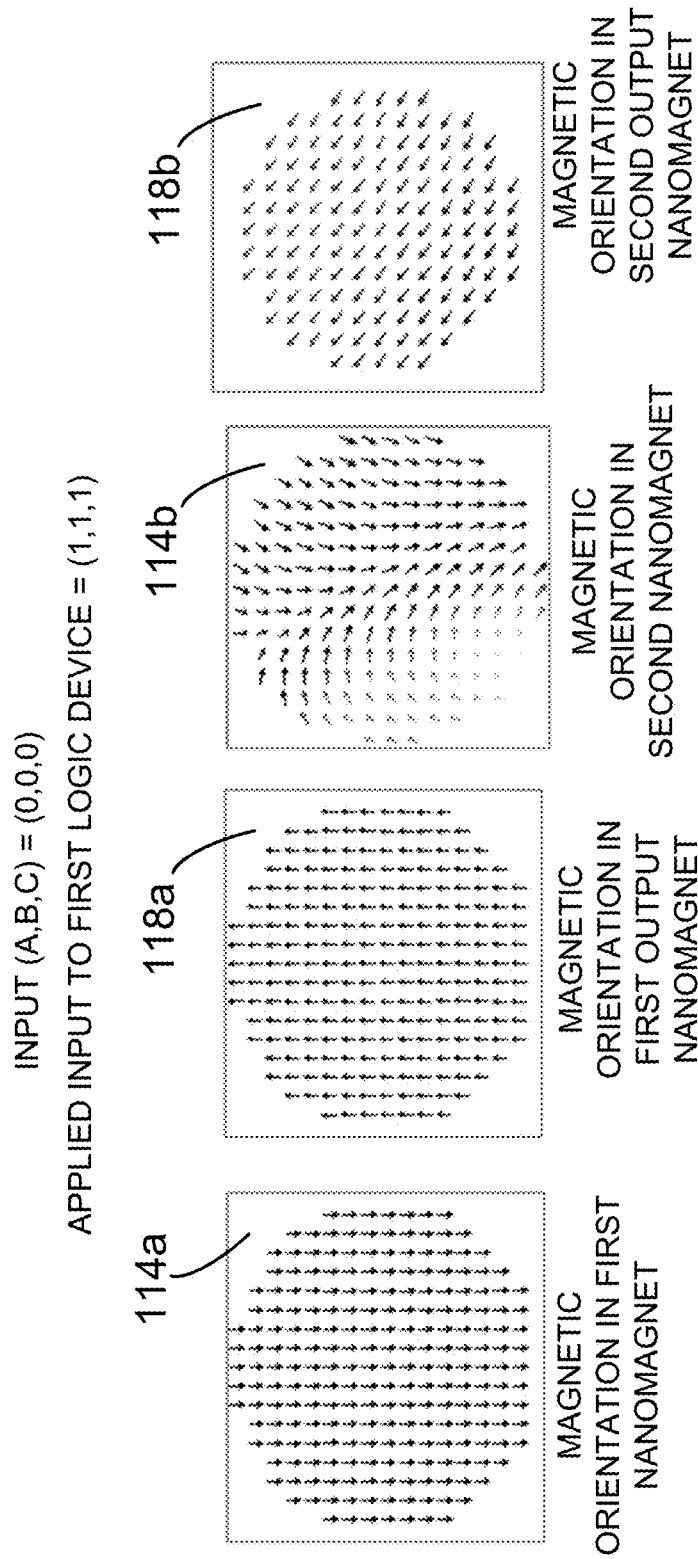
FIGS. 5A to 5H show orientation of the magnetic domain in the first logic device and the second logic device, based on various input values applied to the adder circuit, according to one aspect of the present disclosure.

Now, referring to FIG. 5A, for inputs (A,B,C), value is (0,0,0) and corresponding input of (1,1,1) is applied to the first logic device 108, with resulting orientation of the magnetic domain in the first nanomagnet 114a, first output magnet 118a, second nanomagnet 114b and the second output magnet 118b is shown. Resulting orientation of the magnetic domain in the first output magnet 118a is indicative of a value of 0. And, resulting orientation of the magnetic domain in the second output magnet 118b is indicative of a value of 0. This corresponds to the values shown in row 512 of table 500 in FIG. 5.

Figure 5B:
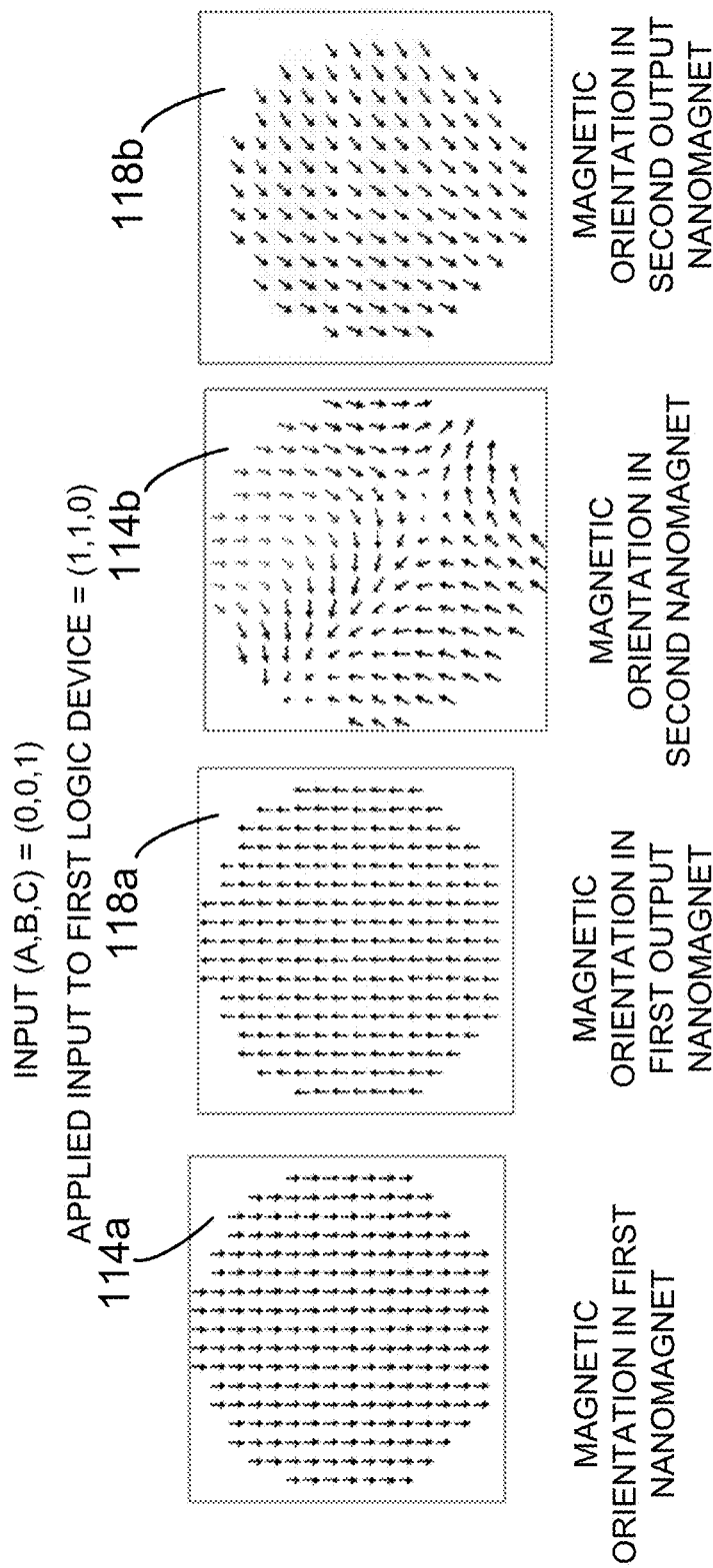

Now, referring to FIG. 5B, for inputs (A,B,C), value is (0,0,1) and corresponding input of (1,1,0) is applied to the first logic device 108, with resulting orientation of the magnetic domain in the first nanomagnet 114a, first output magnet 118a, second nanomagnet 114b and the second output magnet 118b is shown. Resulting orientation of the magnetic domain in the first output magnet 118a is indicative of a value of 0. And, resulting orientation of the magnetic domain in the second output magnet 118b is indicative of a value of 1. This corresponds to the values shown in row 516 of table 500 in FIG. 5.

Figure 5C:
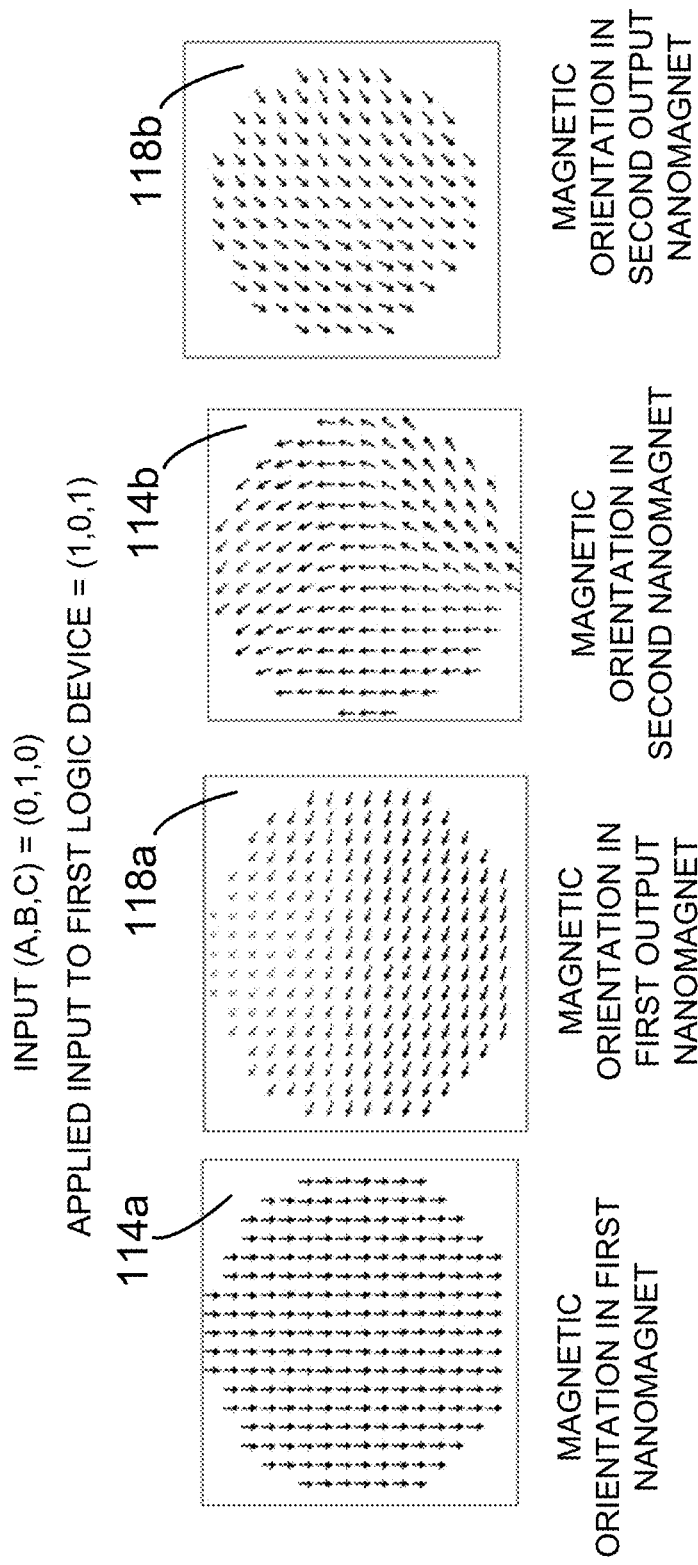

Now, referring to FIG. 5C, for inputs (A,B,C), value is (0,1,0) and corresponding input of (1,0,1) is applied to the first logic device 108, with resulting orientation of the magnetic domain in the first nanomagnet 114a, first output magnet 118a, second nanomagnet 114b and the second output magnet 118b is shown. Resulting orientation of the magnetic domain in the first output magnet 118a is indicative of a value of 0. And, resulting orientation of the magnetic domain in the second output magnet 118b is indicative of a value of 1. This corresponds to the values shown in row 518 of table 500 in FIG. 5.

Figure 5D:
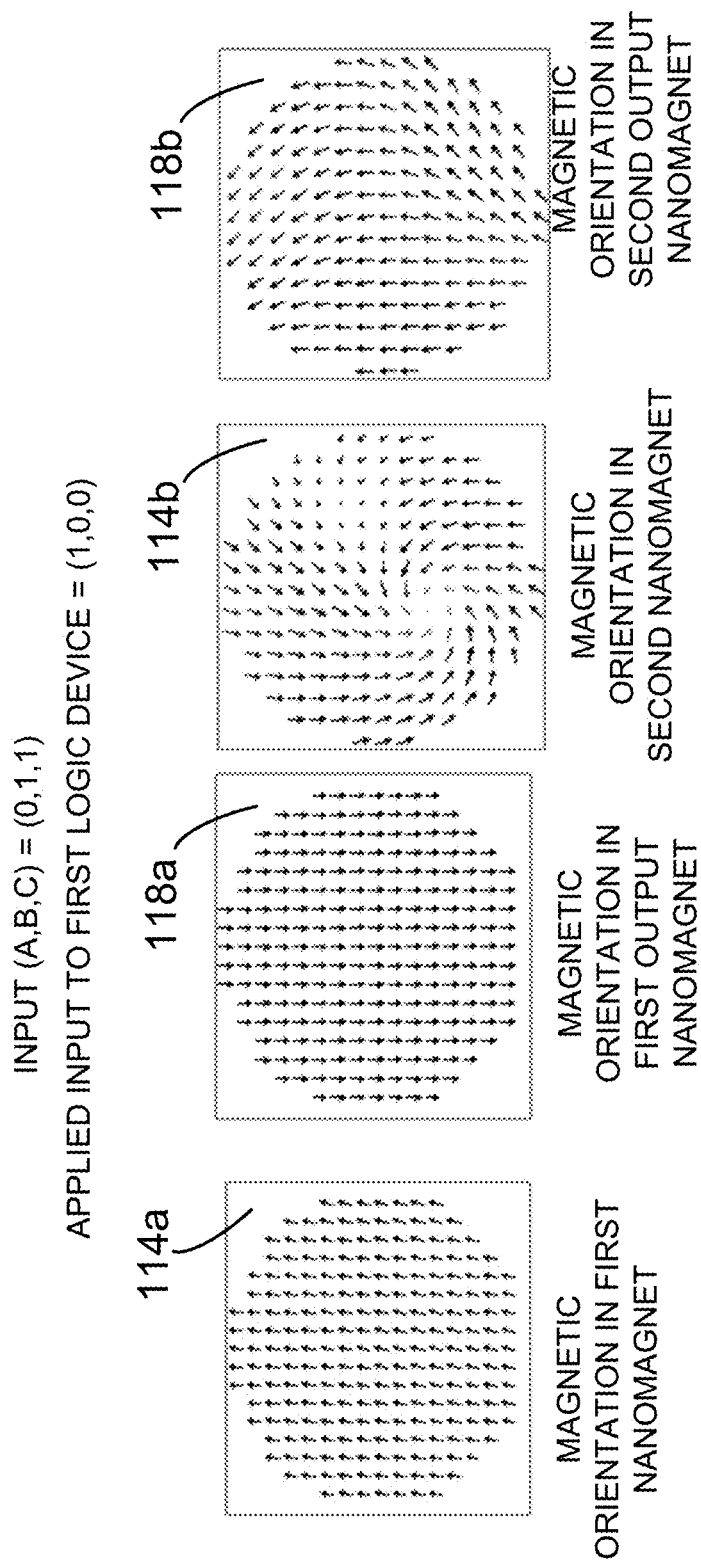

Now, referring to FIG. 5D, for inputs (A,B,C), value is (0,1,1) and corresponding input of (1,0,0) is applied to the first logic device 108, with resulting orientation of the magnetic domain in the first nanomagnet 114a, first output magnet 118a, second nanomagnet 114b and the second output magnet 118b is shown. Resulting orientation of the magnetic domain in the first output magnet 118a is indicative of a value of 1. And, resulting orientation of the magnetic domain in the second output magnet 118b is indicative of a value of 0. This corresponds to the values shown in row 520 of table 500 in FIG. 5.

Figure 5E:
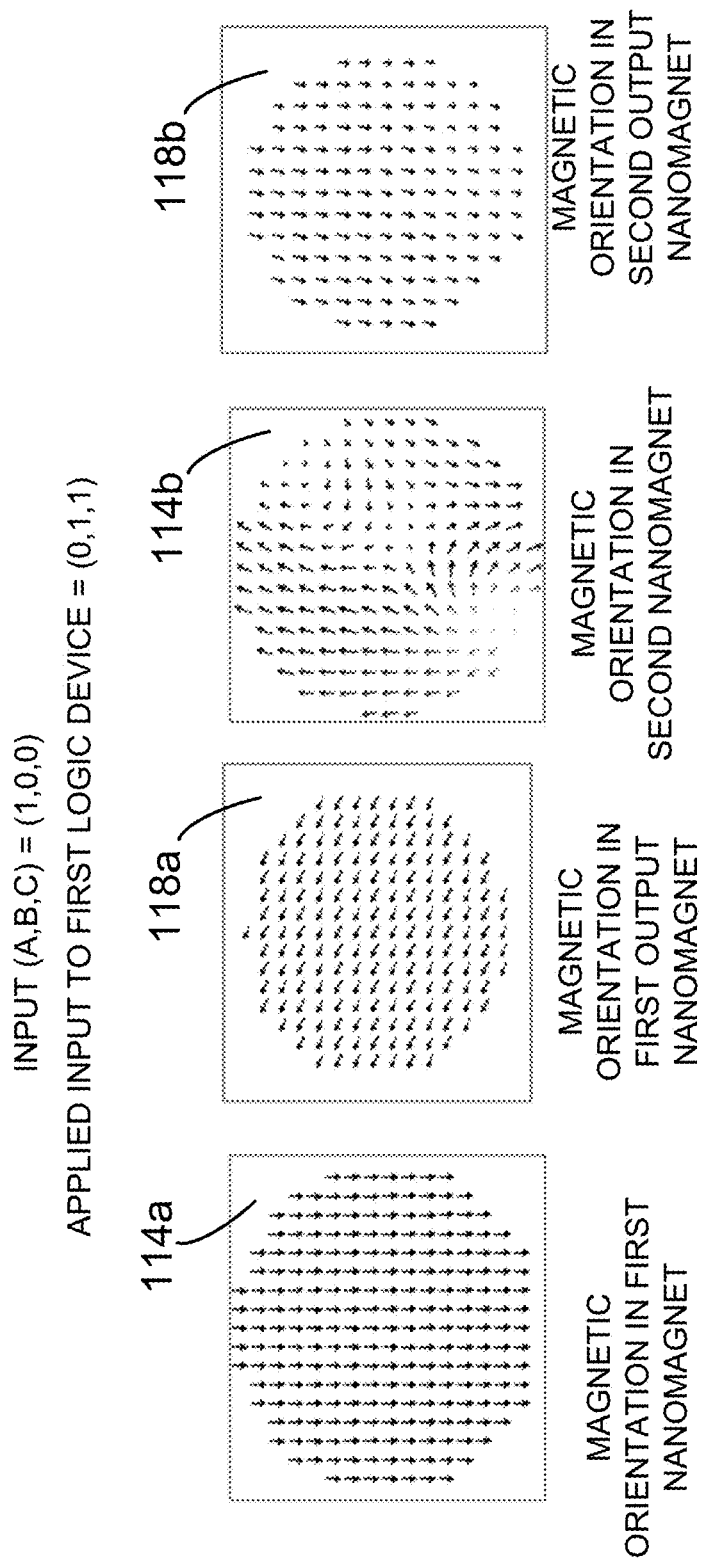

Now, referring to FIG. 5E, for inputs (A,B,C), value is (1,0,0) and corresponding input of (0,1,1) is applied to the first logic device 108, with resulting orientation of the magnetic domain in the first nanomagnet 114a, first output magnet 118a, second nanomagnet 114b and the second output magnet 118b is shown. Resulting orientation of the magnetic domain in the first output magnet 118a is indicative of a value of 0. And, resulting orientation of the magnetic domain in the second output magnet 118b is indicative of a value of 1. This corresponds to the values shown in row 522 of table 500 in FIG. 5.

Figure 5F:
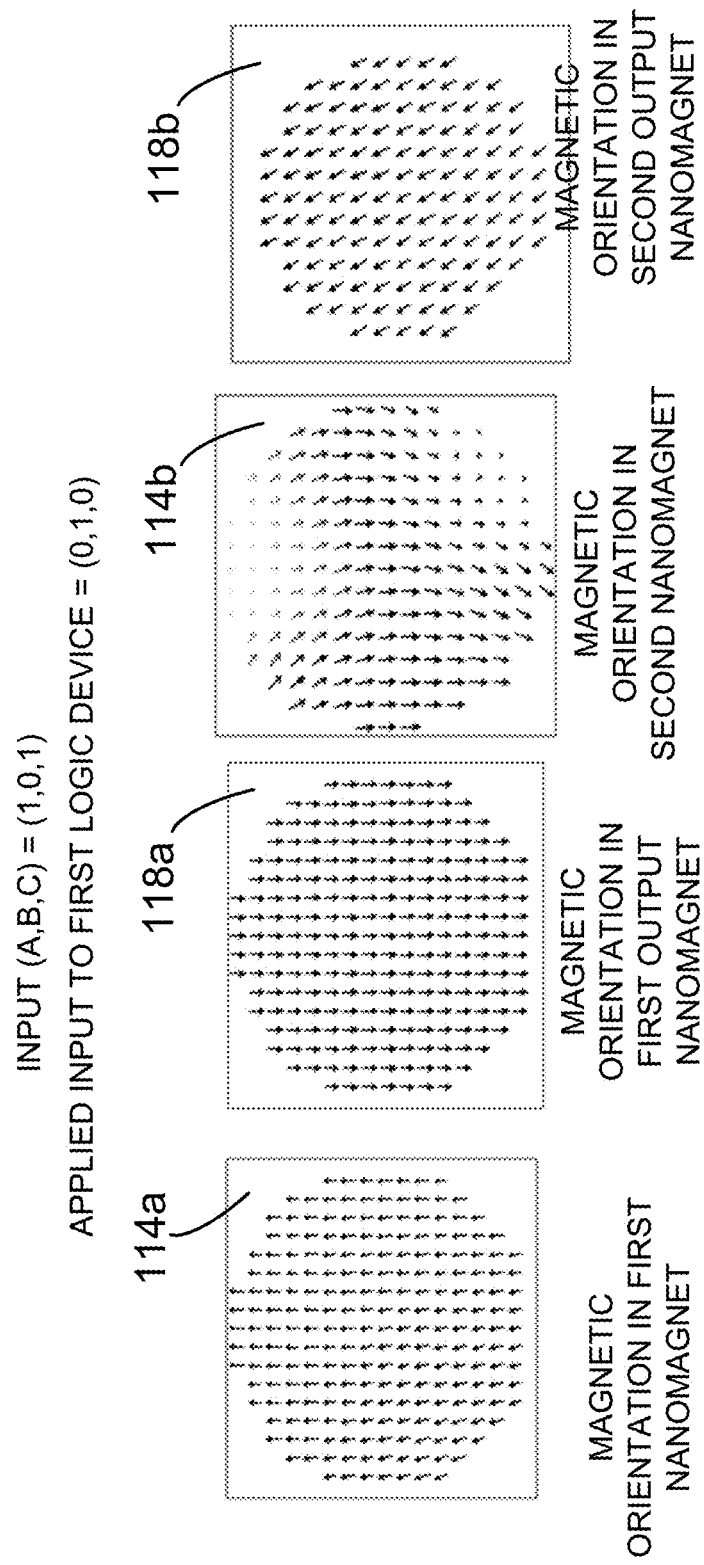

Now, referring to FIG. 5F, for inputs (A,B,C), value is (1,0,1) and corresponding input of (0,1,0) is applied to the first logic device 108, with resulting orientation of the magnetic domain in the first nanomagnet 114a, first output magnet 118a, second nanomagnet 114b and the second output magnet 118b is shown. Resulting orientation of the magnetic domain in the first output magnet 118a is indicative of a value of 1. And, resulting orientation of the magnetic domain in the second output magnet 118b is indicative of a value of 0. This corresponds to the values shown in row 524 of table 500 in FIG. 5.

Figure 5G:
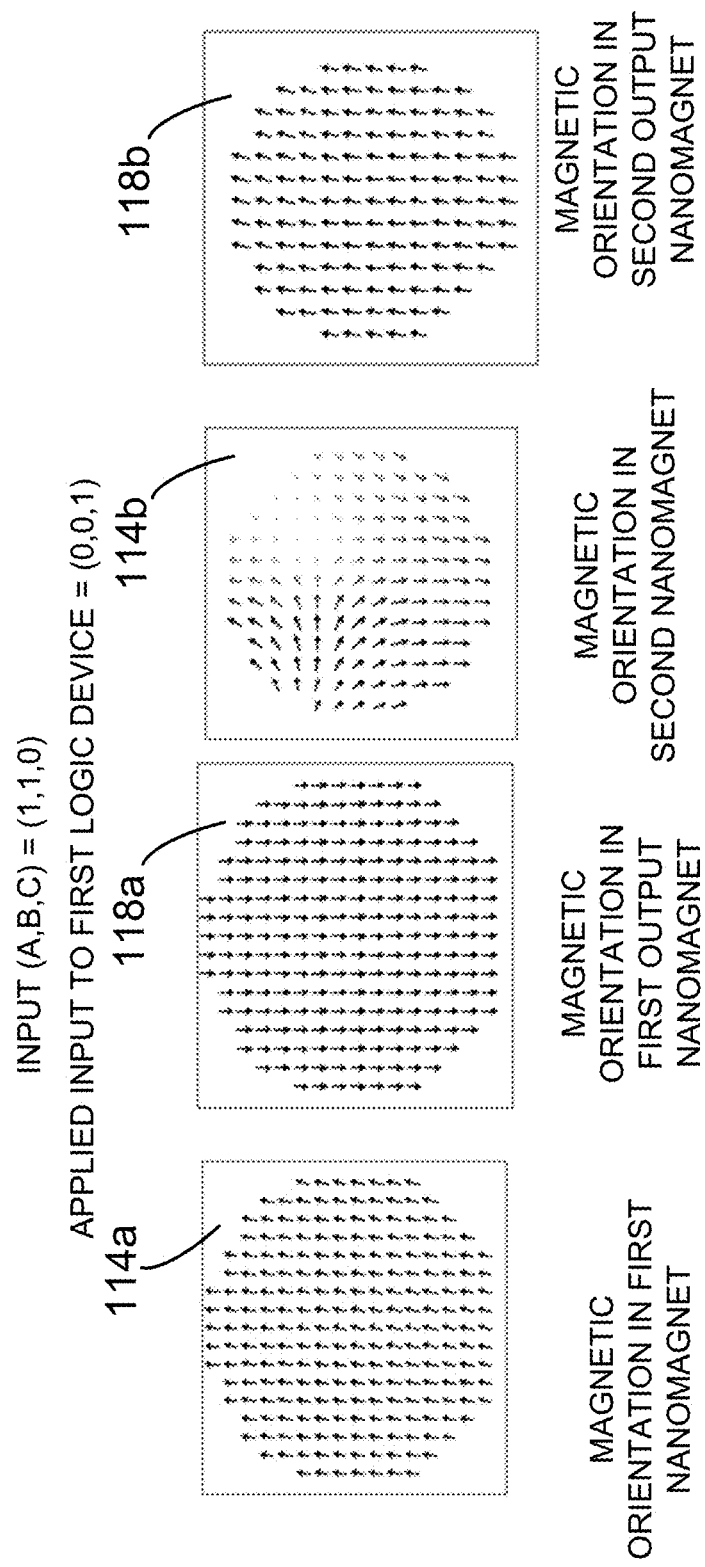

Now, referring to FIG. 5G, for inputs (A,B,C), value is (1,0,1) and corresponding input of (0,1,0) is applied to the first logic device 108, with resulting orientation of the magnetic domain in the first nanomagnet 114a, first output magnet 118a, second nanomagnet 114b and the second output magnet 118b is shown. Resulting orientation of the magnetic domain in the first output magnet 118a is indicative of a value of 1. And, resulting orientation of the magnetic domain in the second output magnet 118b is indicative of a value of 0. This corresponds to the values shown in row 526 of table 500 in FIG. 5.

Figure 5H:
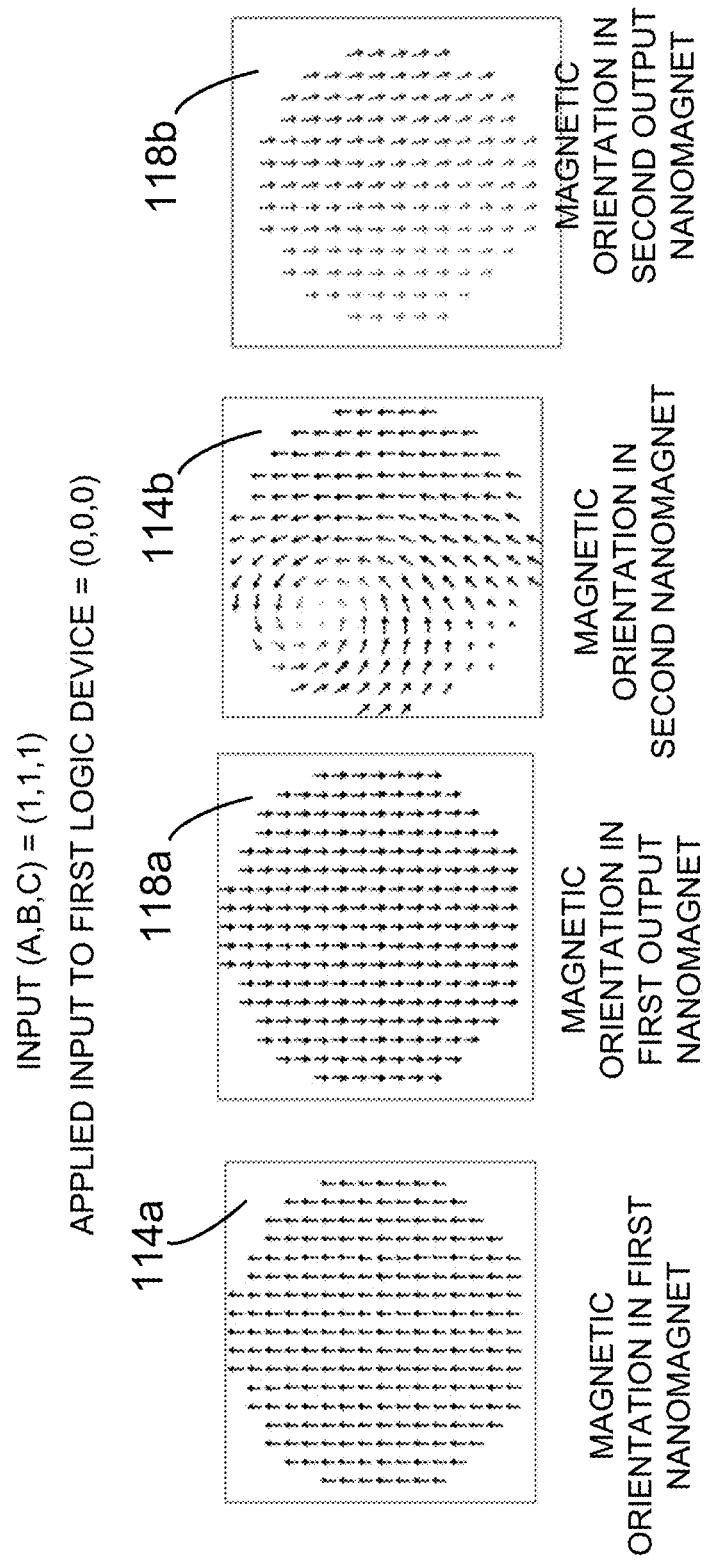

Now, referring to FIG. 5H, for inputs (A,B,C), value is (1,1,1) and corresponding input of (0,0,0) is applied to the first logic device 108, with resulting orientation of the magnetic domain in the first nanomagnet 114a, first output magnet 118a, second nanomagnet 114b and the second output magnet 118b is shown. Resulting orientation of the magnetic domain in the first output magnet 118a is indicative of a value of 1. And, resulting orientation of the magnetic domain in the second output magnet 118b is indicative of a value of 1. This corresponds to the values shown in row 514 of table 500 in FIG. 5.

As one skilled in the art appreciate, a suitable sensor may be operatively disposed relative to the first output magnet 118a and the second output magnet 118b to selectively measure the magnetic orientation of the first output magnet 118a and second output magnet 118b, to determine a polarity of the magnetic domain, thereby determining a value of 0 or 1. As previously described, the value of the first output magnet 118a corresponds to the carry output Cout and the value of the second output magnet 118b corresponds to the sum output Osum of the adder circuit.

Figure 6:
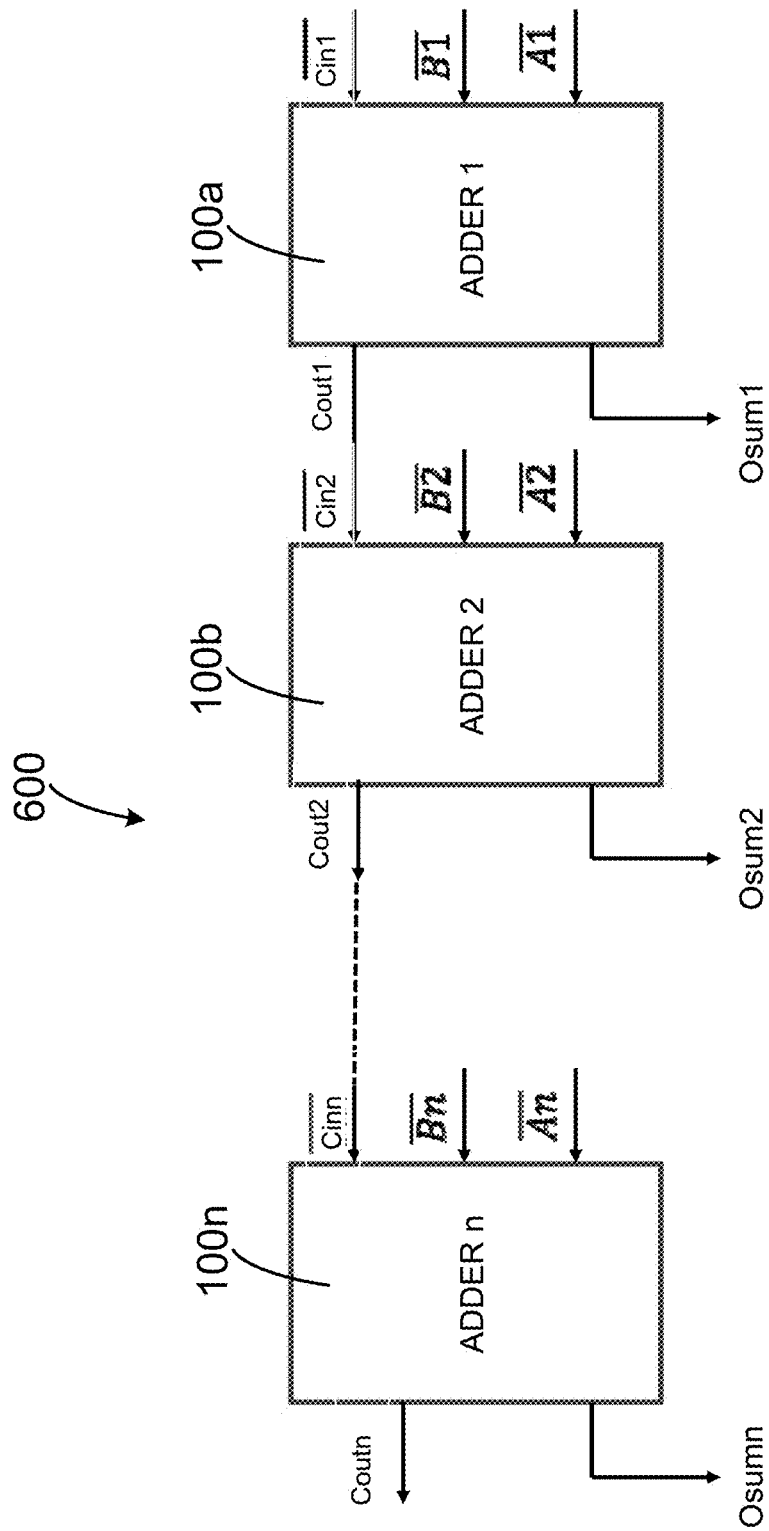
FIG. 6 shows an example block diagram with a plurality of adder circuits, according to one aspect of the present disclosure.

Having described the construction and features of the adder circuit 100, a plurality of adder circuits may be selectively coupled in series to construct a N bit adder circuit. Now, referring to FIG. 6, an example block diagram 600 with a plurality of adder circuits is described. For example, adder 1 circuit 100a is coupled to adder 2 circuit 100b, and eventually adder circuit n−1 (not shown) is coupled to adder circuit 100n. In one example, the adder 1 circuit 100a, adder 2 circuit 100b, and adder circuit 100n are similar in construction and operation as previously described with reference to adder circuit 100. Adder 1 circuit 100a receives inputs (A1, B1, and Cin1), and provides a sum output of Osum1 and a carry output of Cout1. The carry output of Cout1 is fed to Adder 2 circuit 100b, along with inputs (A2 ad B2) and provides a sum output of Osum2 and a carry output of Cout2. Finally, the adder n circuit 100n receives a carry out of Coutn (from adder n−1 circuit), along with inputs An and Bn, and provides a sum output of Osumn and a carry output of Coutn.

Figure 7:
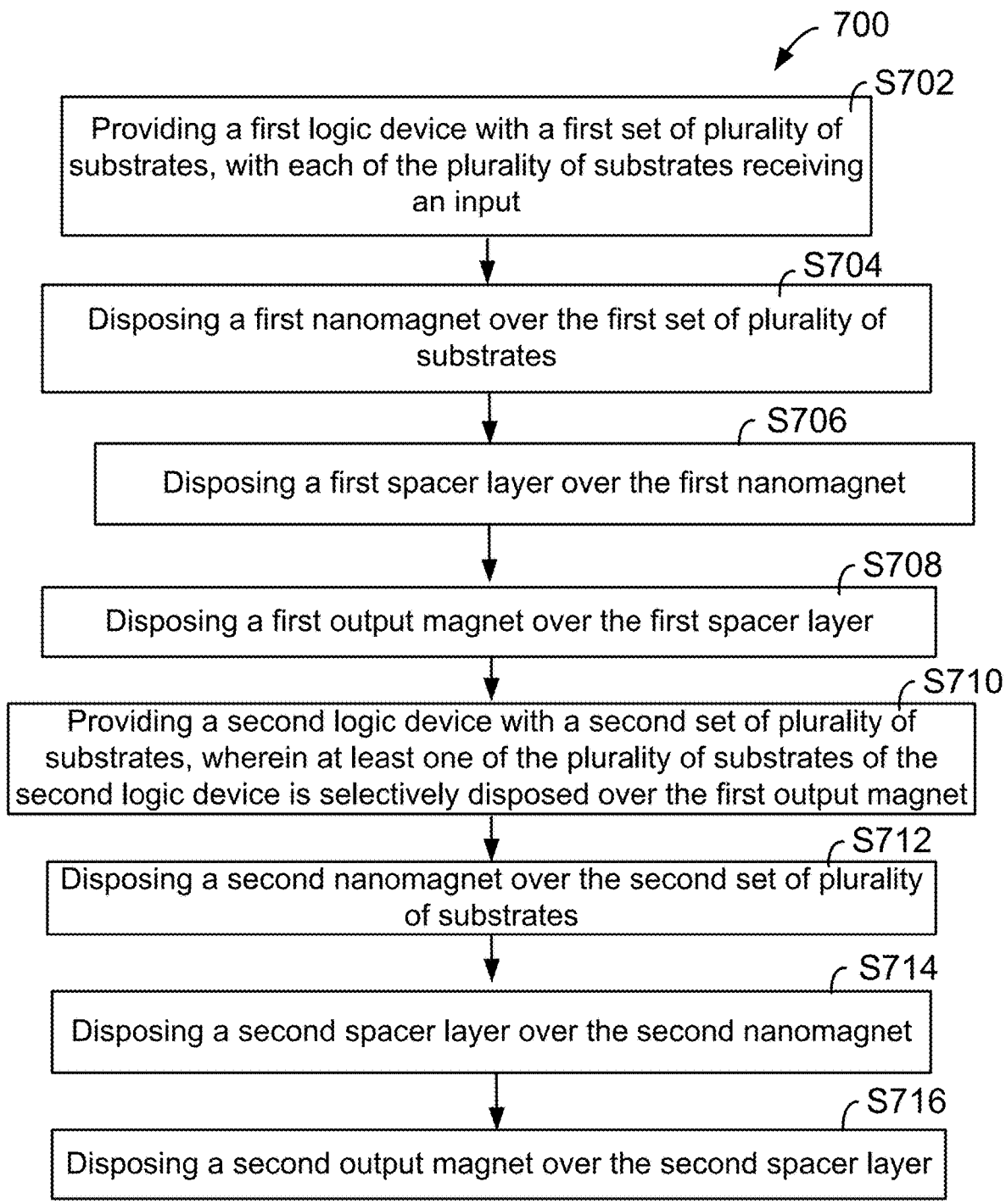
FIG. 7 shows an example flow diagram, according to one aspect of the present disclosure.

Now, referring to FIG. 7, an example flow diagram 700 is described. In block S702, a first logic device with a first set of plurality of substrates are provided, with each of the plurality of substrates receiving an input. For example, the first logic 108 includes a first set of substrates, for example, first substrate 112a, second substrate 112b, and third substrate 112c.

In block S704, a first nanomagnet is disposed over the first set of plurality of substrates. For example, a first nanomagnet 114a is disposed over the first substrate 102a, the second substrate 102b, and the third substrate 102c.

In block S706, a first spacer layer is disposed over the first nanomagnet. For example, a first spacer layer 116a is disposed over the first nanomagnet 114a.

In block S708, a first output magnet is disposed over the first spacer layer. For example, a first output magnet 118a is disposed over the first spacer layer 116a.

In block S710, a second logic device with a second set of plurality of substrates are provided, wherein at least one of the plurality of substrates of the second logic device is selectively disposed over the first output magnet. For example, the second logic device 110 includes a second set of substrates, for example, fourth substrate 112d, fifth substrate 112e, sixth substrate 112f, seventh substrate 112g and eighth substrate 112h. At least seventh substrate 112g and eighth substrate 112h is selectively disposed over the first output magnet 118a.

In block S712, a second nanomagnet is disposed over the second set of plurality of substrates. For example, a second nanomagnet 114b is disposed over the fourth substrate 112d, fifth substrate 112e, sixth substrate 112f, seventh substrate 112g and eighth substrate 112h.

In block S714, a second spacer layer is disposed over the second nanomagnet. For example, a second spacer layer 116b is disposed over the second nanomagnet 114b. In block S716, a second output magnet is disposed over the second spacer layer. For example, a second output magnet 118b is disposed over the second spacer layer 116b.

As one skilled in the art appreciates, in the example device, the interlayer exchange coupled nanomagnet in some examples allows for higher integration density, non-volatility and low power consumption. In some examples, they provide a better reliability by reducing potential random flipping of the nanomagnetic states, thereby permitting greater scalability. As an example, only four nanomagnets have been used to construct the adder circuit, for example, first input nanomagnet, second input nanomagnet, first output nanomagnet and the second output nanomagnet. In some examples, this results in less probabilities of error and reliable system while reducing the area required to construct the adder circuit.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that phraseology or terminology employed herein is for the purpose of description and not of limitation.

While embodiments of the present invention are described above with respect to what is currently considered its preferred embodiments, it is to be understood that the invention is not limited to that described above. To the contrary, the invention is intended to cover various modifications and equivalent arrangements within the spirit and scope of the appended claims.

What is claimed is:

1. A method, including:
providing at least a first logic device and a second logic device, with each of the first logic device and the second logic device including at least three inputs and one output, wherein, the output is based on majority of the inputs; and
selectively feeding the output of the first logic device to the second logic device, wherein, the first logic device and the second logic device together form an adder circuit,
wherein, providing the first logic device further including:
providing a first set of plurality of substrates, each of the plurality of substrates configured to receive one of the inputs;
selectively disposing a first nanomagnet over the first set of plurality of substrate, wherein, the first nanomagent is a single domain nanomagnet;
disposing a first spacer layer over the first nanomagnet; and
disposing a first output magnet over the first spacer layer, wherein, the first output magnet is a single domain nanomagnet.

2. The method of claim 1, wherein, providing the second logic device further including:
providing a second set of plurality of substrates, each of the plurality of substrates configured to receive one of the inputs;
selectively disposing a second nanomagnet over the second set of plurality of substrates, wherein, the second nanomagent is a single domain nanomagnet, and wherein at least one of the plurality of the substrates of the second logic device is selectively disposed over the first output magnet of the first logic device;
disposing a second spacer layer over the second nanomagnet; and
disposing a second output magnet over the second spacer layer, wherein, the second output magnet is a single domain nanomagnet.

3. The method of claim 2, wherein the second logic device includes at least five substrates, and wherein two of the at least five substrates are selectively disposed over the first output magnet, and wherein, the second input nanomagnet is selectively disposed over the at least five substrates.

4. The method of claim 3, further including selectively passing a charge current through each of the plurality of substrates of the first logic device, a direction of the charge current indicative of the input value, and based on the direction of the charge currents, a direction of orientation of the first input nanomagnet is selectively set.

5. The method of claim 4, wherein the direction of orientation of the first input nanomagnet selectively sets a direction of orientation of the first output magnet.

6. The method of claim 5, further including,
inducing a charge current in the two of the at least five substrates of the second logic device selectively disposed over the first output magnet, based on the direction of orientation of the first output magnet;
selectively passing a charge current through each of the other three substrates of the second logic device, a direction of the charge current indicative of the input value; and based on the direction of the charge currents in the at least five substrates, a direction of orientation of the second input nanomagnet is selectively set.

7. The method of claim 6, wherein the direction of orientation of the second input nanomagnet selectively sets a direction of orientation of the second output magnet.

8. The method of claim 6, wherein the first output magnet and the second output magnet, each have a first direction of orientation and a second direction of orientation, with the first direction of orientation substantially opposite to the second direction of orientation, wherein, the first direction of orientation is indicative of a first value, and the second direction of orientation is indicative of a second value, and
wherein, a value indicated by the first output magnet corresponds to a carry output value of the adder circuit and a value indicated by the second output magnet corresponds to a sum output value of the adder circuit.

9. The method of claim 1, wherein, the plurality of substrates of the first logic device and the second logic device are each composed of a heavy metal,
wherein, the charge currents passing through the plurality of substrates in the first logic device produce a spin orbit torque in each of the plurality of substrates in the first logic device and drive an orientation of magnetic field in the first input nanomagnet; and
the first output magnet separated by the space layer obtains an antiferromagnetic coupling from the first input nanomagnet.

10. A device, including:
a first logic device and a second logic device, with each of the first logic device and the second logic device including at least three inputs and one output, wherein, the output is based on majority of the inputs; and
the output of the first logic device is selectively fed to the second logic device, wherein, the first logic device and the second logic device together form an adder circuit, wherein the first logic device further including:
a first set of plurality of substrates, each of the plurality of substrates configured to receive one of the inputs;
a first nanomagnet is selectively disposed over the plurality of substrate, wherein, the first nanomagent is a single domain nanomagnet;
a first spacer layer is disposed over the first nanomagnet; and
a first output magnet is disposed over the first spacer layer, wherein, the first output magnet is a single domain nanomagnet.

11. The device of claim 10, wherein, the second logic device further including:
a second set of plurality of substrates, each of the plurality of substrates configured to receive one of the inputs;
a second nanomagnet is selectively disposed over the plurality of substrate, wherein, the second nanomagent is a single domain nanomagnet, and wherein at least one of the plurality of the substrates of the second logic device is selectively disposed over the first output magnet of the first logic device;
a second spacer layer is disposed over the second nanomagnet; and
a second output magnet is disposed over the second spacer layer, wherein, the second output magnet is a single domain nanomagnet.

12. The device of claim 11, wherein the second logic device includes at least five substrates, and wherein two of the at least five substrates are selectively disposed over the first output magnet, and wherein, the second input nanomagnet is selectively disposed over the at least five substrates.

13. The device of claim 12, wherein a charge current is selectively passed through each of the plurality of substrates of the first logic device, a direction of the charge current indicative of the input value, and based on the direction of the charge currents, a direction of orientation of the first input nanomagnet is selectively set.

14. The device of claim 13, wherein the direction of orientation of the first input nanomagnet selectively sets a direction of orientation of the first output magnet.

15. The system of claim 14, wherein,
a charge current is induced in the two of the at least five substrates of the second logic device selectively disposed over the first output magnet, based on the direction of orientation of the first output magnet;
a charge current is selectively passed through each of the other three substrates of the second logic device, a direction of the charge current indicative of the input value; and based on the direction of the charge currents in the at least five substrates, a direction of orientation of the second input nanomagnet is selectively set.

16. The system of claim 15, wherein the direction of orientation of the second input nanomagnet selectively sets a direction of orientation of the second output magnet.

17. The system of claim 15, wherein the first output magnet and the second output magnet, each have a first direction of orientation and a second direction of orientation, with the first direction of orientation substantially opposite to the second direction of orientation, wherein, the first direction of orientation is indicative of a first value, and the second direction of orientation is indicative of a second value, and
wherein, a value indicated by the first output magnet corresponds to a carry output value of the adder circuit and a value indicated by the second output magnet corresponds to a sum output value of the adder circuit.

18. The system of claim 10, wherein, the plurality of substrates of the first logic device and the second logic device are each composed of a heavy metal,
wherein, the charge currents passing through the plurality of substrates in the first logic device produce a spin orbit torque in each of the plurality of substrates in the first logic device and drive an orientation of magnetic field in the first input nanomagnet; and the first output magnet separated by the space layer obtains an antiferromagnetic coupling from the first input nanomagnet.

* * * * *